(12) United States Patent
Makinouchi

(10) Patent No.: US 6,188,464 B1
(45) Date of Patent: *Feb. 13, 2001

(54) EXPOSURE APPARATUS

(75) Inventor: Susumu Makinouchi, Zama (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/289,614

(22) Filed: Apr. 12, 1999

Related U.S. Application Data

(62) Division of application No. 08/682,992, filed on Jul. 18, 1996, now Pat. No. 5,907,392.

(30) Foreign Application Priority Data

Jul. 20, 1995 (JP) .................................................. 7-206531
Sep. 11, 1995 (JP) .................................................. 7-232273

(51) Int. Cl.[7] ........................... G03B 27/42; G03B 27/54; G03B 27/32
(52) U.S. Cl. ................................. 355/53; 355/67; 355/77
(58) Field of Search .................................. 355/53, 50, 67, 355/77; 356/399, 400–401; 250/548

(56) References Cited

U.S. PATENT DOCUMENTS

| | | | |
|---|---|---|---|
| 5,477,304 | * | 12/1995 | Nishi ...................................... 355/53 |
| 5,483,311 | * | 1/1996 | Sakakibara et al. .................... 355/53 |
| 5,506,684 | | 4/1996 | Ota et al. ............................... 356/401 |
| 5,646,413 | * | 7/1997 | Nishi .................................... 250/548 |
| 5,699,145 | * | 12/1997 | Makinouchi et al. .................. 355/53 |
| 5,721,605 | * | 2/1998 | Mizutani ................................ 355/53 |
| 5,721,608 | * | 2/1998 | Taniguchi .............................. 355/53 |
| 5,781,277 | * | 7/1998 | Iwamoto ................................ 355/53 |
| 5,796,469 | * | 8/1998 | Ebinuma ............................... 355/53 |

OTHER PUBLICATIONS

"Expanding the Horizons of Optical Projection Lithography", Jere D. Buckley, Solid State Technoloby, May 1982, pp. 77–82.

* cited by examiner

Primary Examiner—Russell Adams
Assistant Examiner—Hung Henry Nguyen
(74) Attorney, Agent, or Firm—Oliff & Berridge, PLC

(57) ABSTRACT

A scanning type exposure apparatus comprises a mask stage position-measuring unit, a substrate stage position-measuring unit, an arithmetic processing unit, and a control unit. The arithmetic processing unit multiplies results of measurement (WX, WY, Wθ) by the substrate position-measuring unit by a conversion vector comprising components containing a magnification of a projection optical system and an angle of rotation between a mask and a substrate to determine a target vector quantity (RX*, RY*, Rθ*) of a mask stage. An error vector is determined by subtracting, from the target vector quantity, results of measurement (RX, RY, Rθ) by the mask stage position-measuring unit. The controller controls the mask stage so that the error vector becomes zero. The exposure apparatus includes correcting sections for correcting time lags in measurement by the respective position-measuring units. The arithmetic processing unit uses corrected positional information. The mask stage can accurately follow a substrate stage.

17 Claims, 5 Drawing Sheets

EXPOSURE APPARATUS

This is a Division of application Ser. No. 08/682,992 filed Jul. 18, 1996, which is now U.S. Pat. No. 5,907,392. The entire disclosure of the prior application is hereby incorporated by reference herein in its entirety.

FIELD OF THE INVENTION

The present invention relates to an exposure apparatus to be used for transferring a mask pattern onto a photosensitive substrate during a photolithography process for producing, for example, semiconductor devices, image pick-up devices (CCD, etc.), liquid crystal display devices, and thin film magnetic heads. In particular, the present invention relates to an exposure apparatus which is preferably of the scanning exposure system such as the step-and-scan system.

BACKGROUND OF THE INVENTION

An exposure apparatus is used, for example, for producing semiconductor devices so that a pattern formed on a reticle which is used as a mask is transferred onto each of shot areas on a wafer with a photoresist having been applied thereto. Those often used as such an exposure apparatus have been hitherto represented by a reduction projection type exposure apparatus (stepper) of the step-and-repeat system (full-wafer exposure system). In recent years, however, a projection exposure apparatus of the so-called slit scan system attracts attention in response to the request to increase an area of an objective transfer pattern without increasing the load on a projection optical system so much, in which an image of a pattern on a reticle is successively transferred onto a wafer to be exposed by synchronously scanning the reticle and the wafer with respect to the projection optical system while a part of the pattern on the reticle being projected onto the wafer through the projection optical system.

Especially, when exposure is performed in accordance with the slit scan system while an image being reduction-projected onto each of a plurality of shot areas on a wafer, movement from a certain shot area to the next shot area is performed in accordance with the stepping system. Accordingly, such an exposure system is also called the step-and-scan system. As having been hitherto known, the step-and-scan system has been developed from an aligner in which a pattern on an entire surface of a reticle is transferred onto an entire surface of a wafer at an equivalent magnification by means of one time of scanning exposure.

Upon the operation of the projection exposure apparatus of the scanning exposure system such as the slit scan system and the step-and-scan system as described above, it is necessary to stably move a reticle stage and a wafer stage respectively for scanning in a state in which they are synchronized in a predetermined positional relationship. For this purpose, for example, the following operation has been hitherto performed. Namely, before the start of scanning, alignment is performed for the reticle stage and the wafer stage. After that, the wafer stage is scanned in a predetermined direction at a predetermined velocity, in synchronization with which the reticle stage is scanned at a scanning velocity corresponding to the predetermined velocity of the wafer stage. Further, positional discrepancy amounts of the both stages in the scanning direction and the non-scanning direction (direction perpendicular to the scanning direction) are determined by arithmetic operation. The position of, for example, the reticle stage is finely adjusted so that the determined positional discrepancy amounts are decreased.

In the conventional technique as described above, the positional discrepancy amounts in the scanning and non-scanning directions are determined for the reticle stage and the wafer stage during scanning exposure, and control is performed so that the determined positional discrepancy amounts are independently corrected. Therefore, for example, even when the wafer stage is rotated by yawing during scanning exposure, the positional discrepancy amounts are independently corrected in the scanning direction and the non-scanning direction, resulting in an inconvenience that a positional discrepancy arises between the reticle and the wafer.

In order to overcome the inconvenience, it can be thought that a relative angle of rotation between the reticle stage and the wafer stage is also detected to control the angle of rotation into a predetermined target value. However, when the positional discrepancy amount in the translational direction and the discrepancy amount in the angle of rotation are corrected independently with each other, an inconvenience arises in that the process takes a long following time until the positional discrepancy amounts in the translational direction and in the rotational direction become allowable values or less respectively because of occurrence of another positional discrepancy amount in the translational direction due to rotation.

On the other hand, as the velocity of the stage becomes higher, a problem arises in relation to discrepancy in synchronization between the both stages resulting from a time lag during measurement by position sensors. For example, as for an apparatus which uses a laser interferometer as a position sensor, a time lag of several tens $\mu$sec arises between an actual movement position of a stage and a result of measurement for its position due to a signal processing time in a light-receiving element and a circuit (for example, an analog circuit of a sensor amplifier). If the influence exerted by the time lag is identical with respect to all sensors, then no influence is exerted on synchronous control. However, actually, the time lag is different with respect to each of sensors (dispersion exists between sensors) in almost all cases. Accordingly, discrepancy in synchronization occurs between the reticle stage and the wafer stage, resulting in an inconvenience that the occurrence of discrepancy in synchronization makes a cause of exposure failure. The faster the velocity of the stage is, the larger the positional discrepancy due to the discrepancy in synchronization is.

SUMMARY OF THE INVENTION

A first object of the present invention is to provide an exposure apparatus and a scanning type exposure apparatus in which a mask and a substrate can be subjected to positional adjustment at a high accuracy with high following performance even when one of a mask stage and a substrate stage is rotated due to yawing or the like.

A second object of the present invention is to provide a scanning type exposure apparatus in which it is possible to effectively avoid occurrence of discrepancy in synchronization between a substrate stage and a mask stage caused by time lags in measurement by position sensors provided for the substrate stage and the mask stage.

According to a first aspect of the present invention, there is provided an exposure apparatus for transferring a pattern formed on a mask onto a photosensitive substrate, comprising:

a mask stage for positioning the mask;

a substrate stage for positioning the substrate with respect to the mask pattern;

a mask stage position-measuring unit for measuring a two-dimensional position of the mask stage;

a substrate stage position-measuring unit for measuring a two-dimensional position of the substrate stage;

a processor for determining, from a vector quantity comprising components of results of measurement by one position-measuring unit of the mask stage position-measuring unit and the substrate stage position-measuring unit, a target position vector quantity of the stage corresponding to the other position-measuring unit, and subtracting a vector quantity comprising components of results of measurement by the other position-measuring unit therefrom to determine an error vector; and a controller for controlling a position or a velocity of the stage corresponding to the other position-measuring unit in conformity with the error vector determined by the processor.

According to the present invention, the position of the mask stage is represented, for example, by a two-dimensional position (RX, RY) and an angle of rotation Rθ, and the position of the substrate stage is similarly represented, for example, by a two-dimensional position (WX, WY) and an angle of rotation Wθ. For example, a vector (WX, WY, Wθ) comprising components of the results of measurement for the position of the substrate stage is multiplied by a conversion matrix A comprising components containing, for example, a magnification of a projection optical system and an angle of rotation between the mask and the substrate measured, for example, by alignment, and a predetermined offset vector B is added thereto as shown below. Thus a vector quantity is obtained, which comprises components of a target position (RX*, RY*) and a target angle of rotation Rθ* of the mask stage.

$$\begin{bmatrix} RX^* \\ RY^* \\ R\theta^* \end{bmatrix} = A \begin{bmatrix} WX \\ WY \\ W\theta \end{bmatrix} + B \quad (1)$$

In the foregoing, the matrix A and the offset vector B may be expressed as follows.

$$A = \begin{bmatrix} a_{11} & a_{12} & a_{13} \\ a_{21} & a_{22} & a_{23} \\ a_{31} & a_{32} & a_{33} \end{bmatrix}, B = \begin{bmatrix} b_1 \\ b_2 \\ b_3 \end{bmatrix} \quad (2)$$

Further, the expression (1) may be arranged into the following form of multiplication of a vector quantity and a matrix by introducing the matrix A' of 4 rows×4 columns.

$$\begin{bmatrix} RX^* \\ RY^* \\ R\theta^* \\ 1 \end{bmatrix} = A' \begin{bmatrix} WX \\ WY \\ W\theta \\ 1 \end{bmatrix}, A' = \begin{bmatrix} a_{11} & a_{12} & a_{13} & b_1 \\ a_{21} & a_{22} & a_{23} & b_2 \\ a_{31} & a_{32} & a_{33} & b_3 \\ 0 & 0 & 0 & 1 \end{bmatrix} \quad (3)$$

An error vector quantity (ΔRX, ΔRY, ΔRθ) is obtained, for example, by subtracting a vector quantity (RX, RY, Rθ) comprising components of the actually measured position of the mask stage from the vector (RX*, RY*, Rθ*) representing the target position of the mask stage determined by the expression (3). The position and the angle of rotation of the mask stage are controlled on the basis of the error vector quantity. Thus the mask and the substrate are subjected to positional adjustment at a high accuracy with a high following velocity. Owing to the control as described above, the position and the angle of rotation (orientation) of the mask or the photosensitive substrate are simultaneously adjusted. Accordingly, the time required for positional adjustment is also shortened.

According to a second aspect of the present invention, there is provided a scanning type exposure apparatus for transferring an image of a pattern formed on a mask onto a photosensitive substrate by illuminating the mask and synchronously scanning the mask and the photosensitive substrate with respect to an illumination area on the mask, comprising:

a mask stage for positioning the mask;

a substrate stage for positioning the substrate with respect to the mask pattern;

a mask stage position-measuring unit for measuring a two-dimensional position of the mask stage;

a substrate stage position-measuring unit for measuring a two-dimensional position of the substrate stage;

a projection optical system for projecting the pattern on the mask onto the photosensitive substrate at a predetermined magnification;

a processor for determining, from a vector quantity comprising components of results of measurement by one position-measuring unit of the mask stage position-measuring unit and the substrate stage position-measuring unit, a target vector quantity of the stage corresponding to the other position-measuring unit, and subtracting, from the target vector quantity, a vector quantity comprising components of results of measurement by the other position-measuring unit to determine an error vector; and a controller for controlling a position or a velocity of the stage corresponding to the other position-measuring unit in conformity with the error vector determined by the processor.

The present invention is applied to the scanning type exposure apparatus in which the mask stage and the substrate stage are moved synchronously at high velocities, and thus it is possible to achieve accurate positional adjustment for the mask and the substrate, which is indispensable for synchronous scanning.

According to a third aspect of the present invention, there is provided a scanning type exposure apparatus for transferring an image of a pattern formed on a mask onto a photosensitive substrate by illuminating the mask and synchronously scanning the mask and the photosensitive substrate with respect to an illumination area on the mask, comprising:

a mask stage for positioning the mask;

a substrate stage for positioning the substrate with respect to the mask pattern;

a mask stage position-measuring unit for measuring a two-dimensional position of the mask stage;

a substrate stage position-measuring unit for measuring a two-dimensional position of the substrate stage;

a first time lag-correcting system for correcting a time lag in measurement by the mask stage position-measuring unit;

a second time lag-correcting system for correcting a time lag in measurement by the substrate stage position-measuring unit; and a stage control system for controlling movement of at least one stage of the mask stage and the substrate stage on the basis of positional information on the mask stage of which the time lag has been corrected and positional information on the substrate stage of which the time lag has benn corrected so that the mask stage and the substrate stage are in a predetermined positional relationship.

According to the scanning type exposure apparatus in accordance with the third aspect of the present invention, one stage of the mask stage and the substrate stage, for example, the substrate stage is moved at a controlled movement velocity during scanning for exposure. At this time, the position of the substrate stage is measured by the substrate stage position-measuring unit, and the time lag in the measurement performed by the substrate stage position-measuring unit is corrected by the first time lag-correcting system. On the other hand, the position of the mask stage is measured by the mask stage position-measuring unit, and the time lag in the measurement performed by the mask stage position-measuring unit is corrected by the second time lag-correcting system. The stage control system controls the velocity or the position of the mask stage on the basis of positional information on the substrate stage after correction of the time lag and positional information on the mask stage after correction of the time lag so that the substrate stage and the mask stage are in a predetermined positional relationship.

Accordingly, both of the mask stage and the substrate stage are controlled on the basis of the positional information in which the time lag in the measurement performed by each of the position-measuring units has been corrected by the first and second correcting system so that the both stages are in a predetermined positional relationship. Thus no discrepancy in synchronization between the both stages occurs due to the time lag concerning the positional measurement.

In the scanning type exposure apparatus described above, at least one of the first and second time lag-correcting system can correct the time lag by adding, to a measured position, a product of a scanning velocity v of the corresponding stage and a previously measured inherent lag time (time lag in measurement) $\Delta t$ of the corresponding position-measuring unit. Accordingly, a distance ($\Delta t \times v$) of movement of the stage during the period of the inherent lag time $\Delta t$ of the position-measuring unit is added to the measured value. Therefore, the result is the same as that obtained by real-time measurement of a correct position, and thus no adverse influence arises due to any time lag in measurement. For example, the time lag in measurement is several tens $\mu$sec when a laser interferometer is used as the position-measuring unit. Accordingly, it is allowable to regard that the scanning velocity of the stage is constant during this period of time. Thus the time lag is corrected at an extremely high accuracy.

DETAILED DESCRIPTION OF PREFERRED EMBODIMENTS

First Embodiment

A first embodiment of the exposure apparatus according to the present invention will be explained below with reference to the drawings. In this embodiment, the present invention is applied to a projection exposure apparatus of the step-and-scan system.

Figure 1:
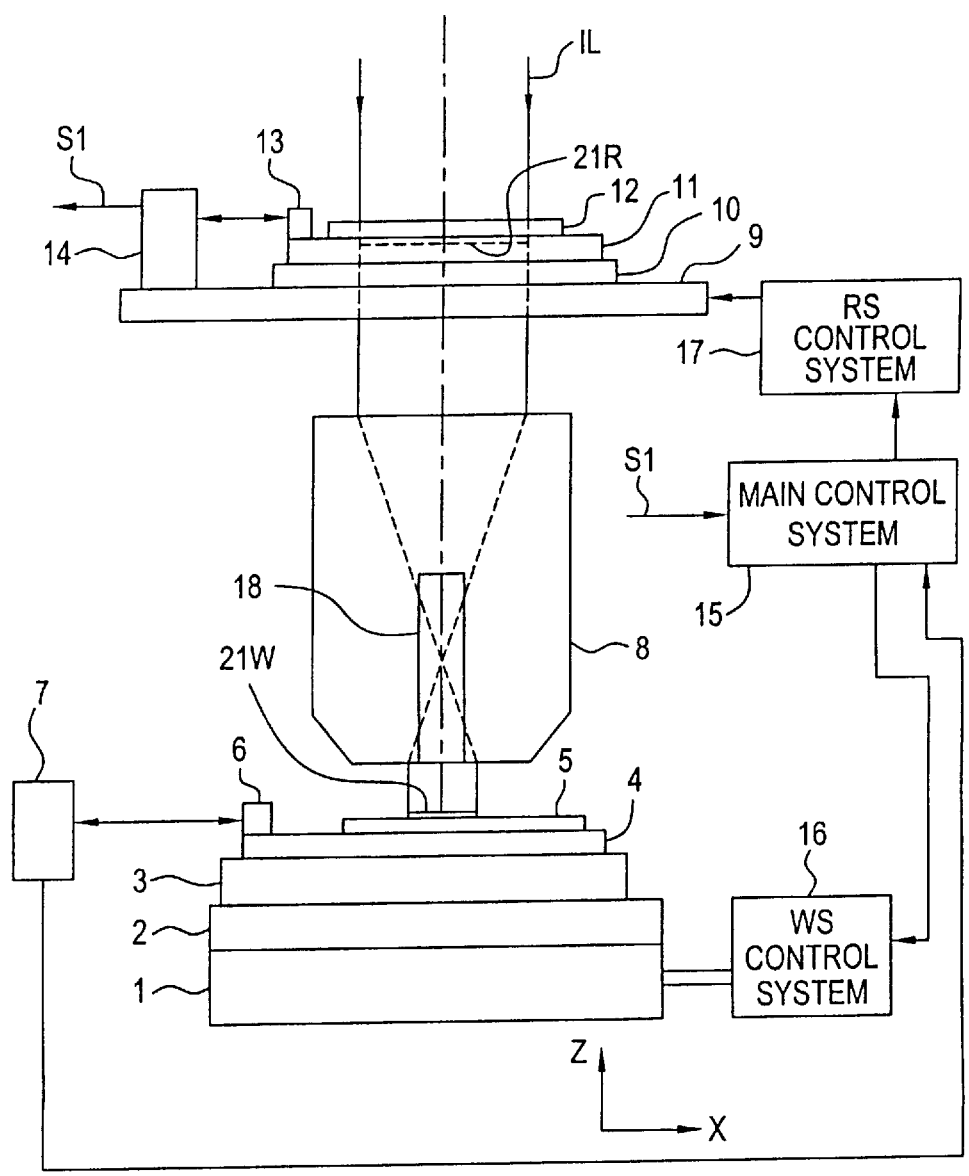
FIG. 1 shows a front view illustrating a stage mechanism in a first embodiment of an exposure apparatus of the present invention.

FIG. 1 shows the projection exposure apparatus of this embodiment. In FIG. 1, a pattern on a pattern formation plane of the reticle 12 is illuminated with a rectangular illumination area 21R (hereinafter referred to as "slit-shaped illumination area") formed by an illumination light beam IL for exposure radiated from an unillustrated illumination optical system. The pattern in the illumination area 21R is reduced at a magnification $\beta$ ($\beta$ is, for example, ¼, ⅕, or another appropriate value) through a projection optical system 8, and it is projected onto a slit-shaped exposure area 21W on a wafer 5 exposed therewith. Now a Z axis is defined in a direction parallel to an optical axis of the projection optical system 8, an X axis is defined in parallel to the plane of the paper of FIG. 1 in a plane perpendicular to the Z axis, and a Y axis is defined perpendicularly to the plane of the paper of FIG. 1 in the plane perpendicular to the Z axis. During the operation of exposure in accordance with the scanning exposure system, the reticle 12 is scanned with respect to the illumination area 21R in the −Y direction (or the +Y direction) at a velocity $V_R$, in synchronization with which the wafer 5 is scanned in the +Y direction (or the −Y direction) at a velocity $\beta \cdot V_R$.

Driving systems for the reticle 12 and the wafer 5 will be explained. A reticle Y axis driving stage 10, which is movable in the Y axis direction, is placed on a reticle support stand 9. A reticle finely driving stage 11 is placed on the reticle Y axis driving stage 10. The reticle 12 is attracted by vacuum and held on the reticle finely driving stage 11. The reticle finely driving stage 11 controls the position of the reticle 12 highly accurately in minute amounts in the X direction parallel to the plane of the paper of FIG. 1, the Y direction, and the rotational direction ($\theta$ direction) in the plane perpendicular to the optical axis of the projection optical system 8. A movement mirror 13 is disposed on the reticle finely driving stage 11, with which the position of the reticle finely driving stage 11 is always monitored for the X direction, the Y direction, and the $\theta$ direction by an interferometer 14 on the reticle side disposed on the reticle support stand 9. Positional information S1 obtained by the interferometer 14 is supplied to a main control system 15.

A wafer Y axis driving stage 2 movable in the Y axis direction is placed on a wafer support stand 1, on which a wafer X axis driving stage 3 movable in the X axis direction is placed, on which a Z$\theta$ axis driving stage 4 is provided. The wafer 5 is attracted by vacuum and held on the Z$\theta$ axis driving stage 4. A movement mirror 6 is also secured on the Z$\theta$ axis driving stage 4, with which the position of the Z$\theta$ axis driving stage 4 is monitored for the X direction, the Y direction, and the θ direction by an interferometer 7 on the wafer side disposed externally. Positional information obtained by the interferometer 7 is also supplied to the main control system 15. The main control system 15 controls the operation of the stages including the wafer Y axis driving stage 2 and the Zθ axis driving stage 4 through a wafer stage control system 16, and it controls the operation of the reticle Y axis driving stage 10 and the reticle finely driving stage 11 through a reticle stage control system 17. The main control system 15 inclusively controls the operation of the entire apparatus.

A reference mark member (not shown), on which a reference mark to serve as a reference for alignment of the reticle 12 and the wafer 5 is formed, is secured on the Zθ axis driving stage 4. A reticle alignment microscope (not shown) for detecting a positional discrepancy amount between the reference mark and the reticle 12 is disposed over the reticle 12. An alignment sensor 18 of the off-axis system for detecting the position of a wafer mark formed on the wafer 5 for alignment is disposed at a side surface portion in the Y direction of the projection optical system 8. Alignment is performed for the reticle 12 and the wafer 5 by principally using the reference mark member and the alignment sensor 18.

Figure 2A:
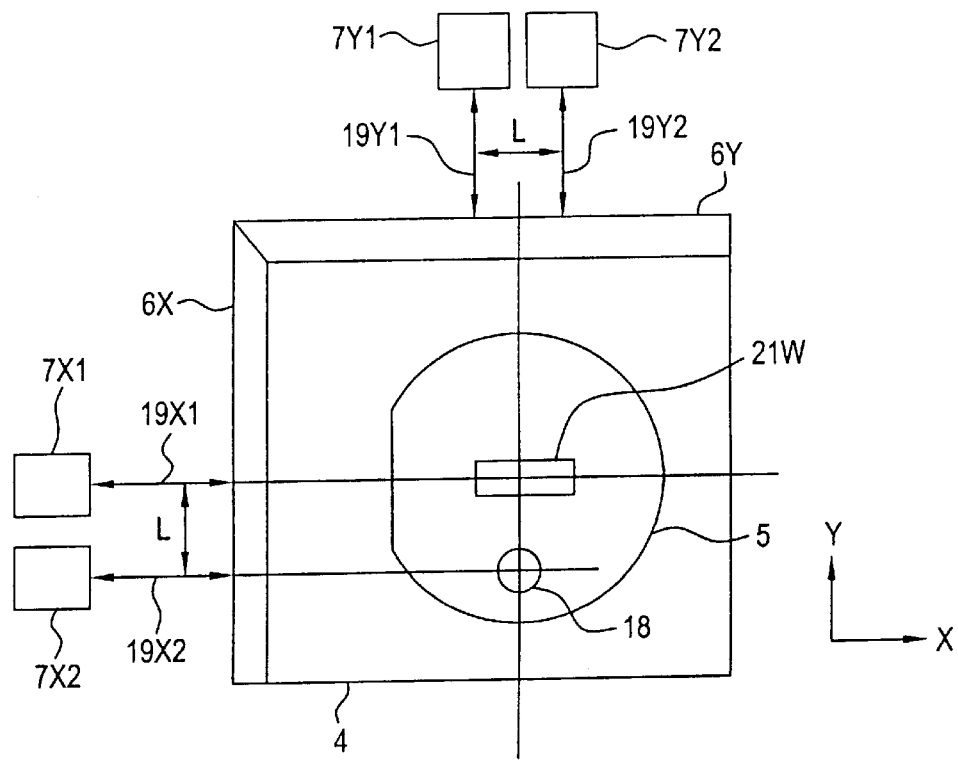
FIG. 2A shows a plan view illustrating a stage system disposed on a wafer side of the exposure apparatus shown in FIG. 1.

Details of the wafer stage and the reticle stage will be explained below with reference to FIG. 2. FIG. 2A shows a plan view of the wafer stage. In FIG. 2A, the wafer 5 is placed on the Zθ axis driving stage 4. A movement mirror 6X for the X axis and a movement mirror 6Y for the Y axis are secured on the Zθ axis driving stage 4. An image of the pattern formed on the reticle is projected onto the slit-shaped exposure area 21W on the wafer 5 during exposure. The Zθ axis driving stage 4 is driven in the Y direction (scanning direction) by the wafer Y axis driving stage 2 shown in FIG. 1 in accordance with a linear motor system, and it is driven in the X direction by the wafer X axis driving stage 3 in accordance with a feed screw system.

The movement mirror 6X is irradiated with laser beams 19X1 and 19X2 radiated from interferometers 7X1 and 7X2 for the X axis at a spacing distance L along optical paths which are in parallel to the X axis and pass through the optical axis of the projection optical system 8 and the optical axis of the alignment sensor 18 respectively. The movement mirror 6Y is irradiated with laser beams 19Y1 and 19Y2 radiated from interferometers 7Y1 and 7Y2 for the Y axis at a spacing distance L along optical paths which are parallel to the Y axis. Positional information on the Zθ axis driving stage 4 to be used in this embodiment is information having four degrees of freedom comprising measured values WX1 and WX2 for the X axis obtained by the interferometers 7X1 and 7X2 and measured values WY1 and WY2 for the Y axis obtained by the interferometers 7Y1 and 7Y2. Therefore, in this embodiment, an angle of rotation caused by yawing can be also detected in addition to the position of the Zθ axis driving stage 4 with respect to the X and Y directions. The angle of rotation can be detected, for example, even when the interferometer 7X2 or the interferometer 7Y2 is omitted. However, the accuracy for detecting the position and the yawing is increased by detecting the positional information having the four degrees of freedom to obtain an averaging effect as performed in this embodiment.

The position in the X axis direction upon the use of the alignment sensor 18 of the off-axis system is controlled on the basis of the measured value obtained by the interferometer 7X2 which uses the laser beam 19X2. Accordingly, the so-called Abbe error is not generated.

Figure 2B:
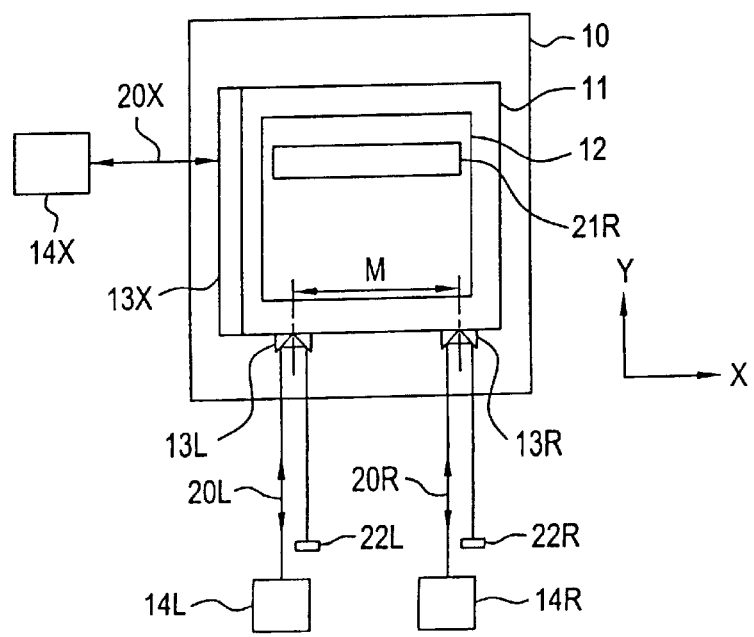
FIG. 2B shows a plan view illustrating a stage system disposed on a reticle side of the exposure apparatus shown in FIG. 1.

FIG. 2B shows a plan view of the reticle stage. In FIG. 2B, the reticle finely driving stage 11 is placed on the reticle Y axis driving stage 10, on which the reticle 12 is held. A movement mirror 13X for the X axis and two corner cubes 13L, 13R for the Y axis are secured to the reticle finely driving stage 11. The movement mirror 13X is irradiated with a laser beam 20X radiated from an interferometer 14X in parallel to the X axis. The corner cubes 13L, 13R are irradiated with laser beams 20L, 20R radiated from interferometers 14L, 14R for the Y axis at a spacing distance M in parallel to the Y axis respectively.

The laser beams 20L, 20R reflected by the corner cubes 13L, 13R are returned to the corner cubes 13L, 13R through reflective mirrors 22L, 22R respectively, and then they are returned to the interferometers 14L, 14R. Namely, the interferometers 14L, 14R for the reticle are arranged as a double-path interferometer. Thus this arrangement causes no positional discrepancy of the laser beams due to rotation of the reticle finely driving stage 11. The slit-shaped exposure area 21R on the reticle 12 is illuminated with an exposure light beam at a uniform illuminance during exposure.

In this embodiment, the reticle Y axis driving stage 10 is driven in the Y direction in accordance with a linear motor system along two driving axes disposed substantially in parallel to the laser beams 20L, 20R. The reticle finely driving stage 11 is driven in the X direction with respect to the reticle Y axis driving stage by an unillustrated actuator along a driving axis disposed substantially in parallel to the laser beam 20X. In this embodiment, the balance of driving amounts of the two linear motors for the Y axis is changeable. Accordingly, the reticle Y axis driving stage 10, and thus the reticle finely driving stage 11 can be rotated within a predetermined range. Namely, the reticle finely driving stage 11 is driven by the driving system having three degrees of freedom as a whole.

A measured value RX obtained by the interferometer 14X is used as positional information on the reticle finely driving stage 11 in the X direction. Measured values RL, RR obtained by the interferometers 14L, 14R are used as positional information on the reticle finely driving stage 11 in the Y direction along the two driving axes of the linear motors.

As a modified embodiment, it is allowable to adopt an arrangement in which the reticle finely driving stage 11 can be finely moved with respect to the reticle Y axis driving stage 10 at three degrees of freedom along driving axes substantially parallel to the laser beams 20L, 20R, 20X. In such an embodiment, the stage on the reticle side is driven at five degrees of freedom as a whole. However, the control system of the first embodiment can be used substantially as it is, for example, by driving the two linear motors for driving the reticle Y axis driving stage in the Y direction in accordance with open loop control at a constant velocity, and correcting the positional discrepancy between the reticle 12 and the wafer 5 by controlling the driving system having the three degrees of freedom for finely driving the reticle finely driving stage 11 in accordance with closed loop control.

Next, a method for synchronously controlling the projection exposure apparatus of this embodiment during scanning exposure will be explained with reference to FIG. 3.

Figure 3:
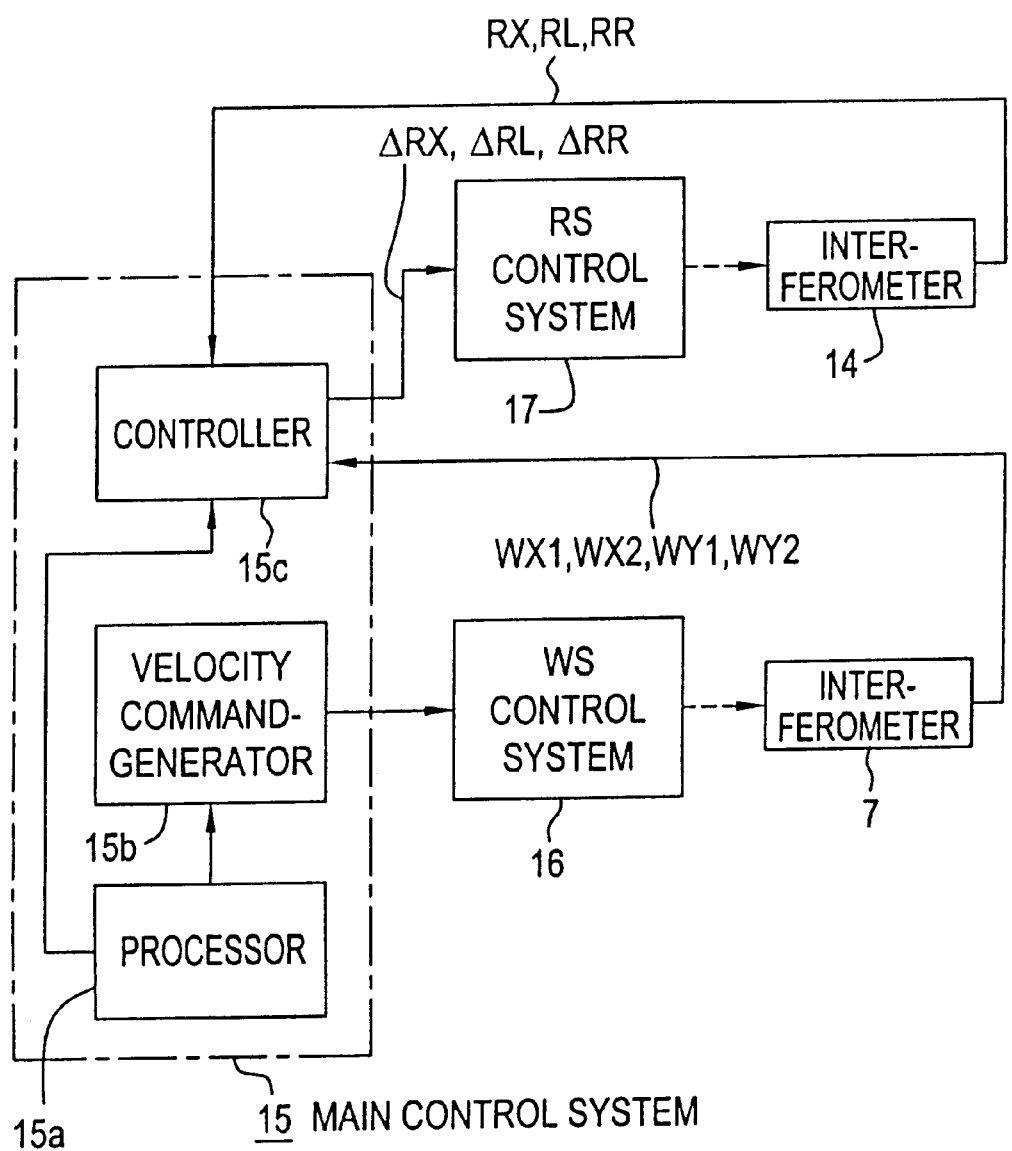
FIG. 3 shows a diagram, partially in a functional block diagram, illustrating a stage control system in the embodiment of the exposure apparatus of the present invention.

FIG. 3 shows an arrangement of a control system for the stages in this embodiment. In FIG. 3, it is assumed that the reticle and the wafer have been subjected to alignment, and the reticle and the wafer have been positioned at scanning start positions respectively. When a controller (control means) 15a in the main control system 15 supplies a command for starting scanning exposure to a velocity command-generator 15b and a processor (an arithmetic processing means) 15c, then the velocity command-generator 15b supplies a velocity command signal to the wafer stage control system 16, the velocity command signal indicating a target velocity in the X direction (usually zero) and a target scanning velocity $V_W^*$ in the Y direction of the Zθ axis driving stage 4 disposed on the wafer side in FIG. 2. The latter target scanning velocity $V_W^*$ in the Y direction changes in a trapezoidal shape with respect to time such that it gradually increases from zero, arrives at a constant scanning velocity $V_{W0}$, maintains the velocity for a predetermined period of time, and then gradually returns to zero again. It is noted that the controller 15a, the velocity command-generator 15b, and the processor (arithmetic processing means) 15c are functions realized on a software of a computer respectively.

In conformity with the foregoing operation, the wafer stage control system 16 drives the wafer Y axis driving stage 2 shown in FIG. 1 in the Y direction at the target scanning velocity $V_W^*$ in accordance with open loop control, and it drives the wafer X axis driving stage 3 in the X direction at the target velocity, if necessary. During this process, the positions WX1, WX2, WY1, WY2 of the Zθ axis driving stage 4, which are measured by the four interferometers 7X1, 7X2, 7Y1, 7Y2 shown in FIG. 2A, are supplied to the processor 15c shown in FIG. 3 at a predetermined sampling frequency. The processor 15c firstly uses the spacing distance L between the two laser beams 19X1, 19X2 and the spacing distance L between the laser beams 19Y1, 19Y2 shown in FIG. 2A so that a vector comprising the measured values WX1, WX2, WY1, WY2 is multiplied by a matrix T1 defined by the following expression to convert the vector into a vector comprising the position in the X direction WX, the position in the Y direction WY, and the angle of rotation Wθ of the Zθ axis driving stage 4.

$$\begin{bmatrix} WX \\ WY \\ W\theta \end{bmatrix} = \begin{bmatrix} 1/2 & 1/2 & 0 & 0 \\ 0 & 0 & 1/2 & 1/2 \\ \frac{1}{L\cdot 2} & \frac{-1}{L\cdot 2} & \frac{-1}{L\cdot 2} & \frac{1}{L\cdot 2} \end{bmatrix} \begin{bmatrix} WX1 \\ WX2 \\ WY1 \\ WY2 \end{bmatrix} = T1 \begin{bmatrix} WX1 \\ WX2 \\ WY1 \\ WY2 \end{bmatrix} \quad (4)$$

Next, the processor 15c introduces matrixes T3, T2 comprising components of functions of an angle of relative rotation θ between the reticle 12 and the wafer 5 determined by alignment and a projection magnification β from the reticle 12 to the wafer 5, and an offset vector B defined in the following expression. Thus a vector (RX*, RY*, Rθ*) comprising components of a target position RX* in the X direction, a target position RY* in the Y direction, and a target angle of rotation Rθ* of the reticle finely driving stage 11 shown in FIG. 2B is calculated from the vector (WX, WY, Wθ) comprising the components of the positions and the angle of rotation of the Zθ axis driving stage 4.

$$\begin{bmatrix} RX^* \\ RY^* \\ R\theta^* \end{bmatrix} = \begin{bmatrix} \cos\theta & -\sin\theta & 0 \\ \sin\theta & \cos\theta & 0 \\ 0 & 0 & 1+\theta \end{bmatrix} \begin{bmatrix} 1/\beta & 0 & 0 \\ 0 & 1/\beta & 0 \\ 0 & 0 & 1 \end{bmatrix} \begin{bmatrix} WX \\ WY \\ W\theta \end{bmatrix} + B \quad (5)$$

$$= T3 \cdot T2 \begin{bmatrix} WX \\ WY \\ W\theta \end{bmatrix} + B$$

As understood from comparison between the expressions (1) and (5), an example of the matrix A used in the expression (1) is a matrix T3·T2. Further, the processor 15c uses a matrix T4 comprising components of the spacing distance M between the laser beams 20L, 20R shown in FIG. 2B as defined in the following expression so that the vector (RX*, RY*, Rθ*) is converted into a vector (RX*, RL*, RR*) comprising target positions corresponding to the three driving axes of the reticle finely driving stage 11 shown in FIG. 2B. In other words, the vector (RX*, RL*, RR*) is a vector which represents the target position of the reticle finely driving stage 11 to be measured by the interferometers 14X, 14L, 14R during scanning exposure.

$$\begin{bmatrix} RX^* \\ RL^* \\ RR^* \end{bmatrix} = \begin{bmatrix} 1 & 0 & 0 \\ 0 & 1 & M/2 \\ 0 & 1 & -M/2 \end{bmatrix} \begin{bmatrix} RX^* \\ RY^* \\ R\theta^* \end{bmatrix} = T4 \begin{bmatrix} RX^* \\ RY^* \\ R\theta^* \end{bmatrix} \quad (6)$$

In FIG. 3, the positions RX, RL, RR actually measured by the interferometer 14 (representing the whole of the interferometers 14X, 14L, 14R shown in FIG. 2B) disposed on the reticle side are also supplied to the processor 15c. The processor 15c subtracts a vector (RX, RL, RR) representing the actual position of the reticle finely driving stage 11 from the vector (RX*, RL*, RR*) representing the target position of the reticle finely driving stage 11 to obtain an error vector (ΔRX, ΔRL, ΔRR) in accordance with the following expression. The error vector is also expressed as an operation expression comprising the vector (WX1, WX2, WY1, WY2) which represents the position of the Zθ axis driving stage 4 described above, the matrixes T1 to T4, and other terms.

$$\begin{bmatrix} \Delta RX \\ \Delta RL \\ \Delta RR \end{bmatrix} = \begin{bmatrix} RX^* \\ RL^* \\ RR^* \end{bmatrix} - \begin{bmatrix} RX \\ RL \\ RR \end{bmatrix} \quad (7)$$

$$= T4 \cdot T3 \cdot T2 \cdot T1 \begin{bmatrix} WX1 \\ WX2 \\ WY1 \\ WY2 \end{bmatrix} + B - \begin{bmatrix} RX \\ RL \\ RR \end{bmatrix}$$

The processor 15c supplies the error vector (ΔRX, ΔRL, ΔRR) thus determined to the reticle stage control system 17. The reticle stage control system 17 controls the driving system having the three degrees of freedom for the reticle finely driving stage 11 shown in FIG. 2B so that the supplied error vector becomes (0, 0, 0). A result of this control is supplied in a feedback manner to the processor 15c as measured values obtained by the three interferometers 14X, 14L, 14R, and the reticle finely driving stage 11 is driven in accordance with closed loop control. As a result, the Zθ axis driving stage 4 (wafer 5) is driven in the +Y direction at a constant velocity $V_{W0}$, in synchronization with which the reticle finely driving stage 11 (reticle 12) is driven in the −Y direction at a velocity $(1/\beta)V_{W0}$ while maintaining an angle of relative rotation θ.

According to the present invention, as described above, the vector (RX*, RL*, RR*), which represents the target position and the target angle of rotation of the reticle finely driving stage 11, is calculated by multiplying the vector (WX1, WX2, WY1, WY2) comprising elements of the position having four degrees of freedom of the Zθ axis driving stage 4 on the wafer side by the matrix (T4·T3·T2·T1), and subtracting the offset vector B therefrom as shown in the expression (7). Thus positional adjustment is performed on the basis of the target position. Therefore, even if yawing occurs in the wafer Y axis driving stage 2 during scanning exposure, and the Zθ axis driving stage 4 is rotated, then the target position and the target angle of rotation of the reticle finely driving stage 11 are updated, and the position and the angle of rotation of the reticle finely driving stage 11 are corrected approximately in real-time.

Accordingly, synchronous scanning is performed at a high following velocity in a state in which the reticle 12 and the wafer 5 are subjected to positional adjustment at a high accuracy.

In the aforementioned embodiment, as shown in FIG. 3, the wafer stage control system 16 is controlled on the basis of the velocity. However, the wafer stage control system 16 may be controlled on the basis of the position. Namely, information on the target position, which changes at every moment, may be supplied to the wafer stage control system 16 at a predetermined cycle, in accordance with which the wafer stage control system 16 may be allowed to change, for example, the position of the wafer Y axis driving stage 2.

In the arrangement shown in FIG. 1, the reticle 12 is placed on the reticle Y axis driving stage 10 through the reticle finely driving stage 11. However, the reticle finely driving stage 11 may be omitted, and finely driving stages for changing the position of the wafer 5 in a predetermined range in the Y direction may be arranged at two positions spaced apart by a predetermined spacing distance in the X direction between the wafer 5 and the wafer Y axis driving stage 2. In such an arrangement, the reticle Y axis driving stage 10 may be controlled in accordance with open loop control, and the wafer Y axis driving stage 2, the finely driving stages and so on disposed on the wafer side may be controlled in accordance with a closed loop system in conformity with a target position calculated from a measured position of the reticle Y axis driving stage 10.

In the aforementioned embodiment, as shown in FIG. 2, the position of the stage on the wafer side is measured by using the four degrees of freedom, and the position of the stage on the reticle side is measured by using the three degrees of freedom. However, the positions of the stage on the wafer side and the stage on the reticle side may be measured by using three degrees of freedom respectively. Alternatively, for example, the position of the stage on the wafer side may be measured by using three degrees of freedom, and the position of the stage on the reticle side may be measured by using four degrees of freedom, or the positions of the stages on the wafer side and the reticle side may be measured by using four or more degrees of freedom respectively. As the degree of freedom in measurement increases, the accuracy of measurement for the position and the angle of rotation is improved owing to the averaging effect.

Second Embodiment

Figure 4:
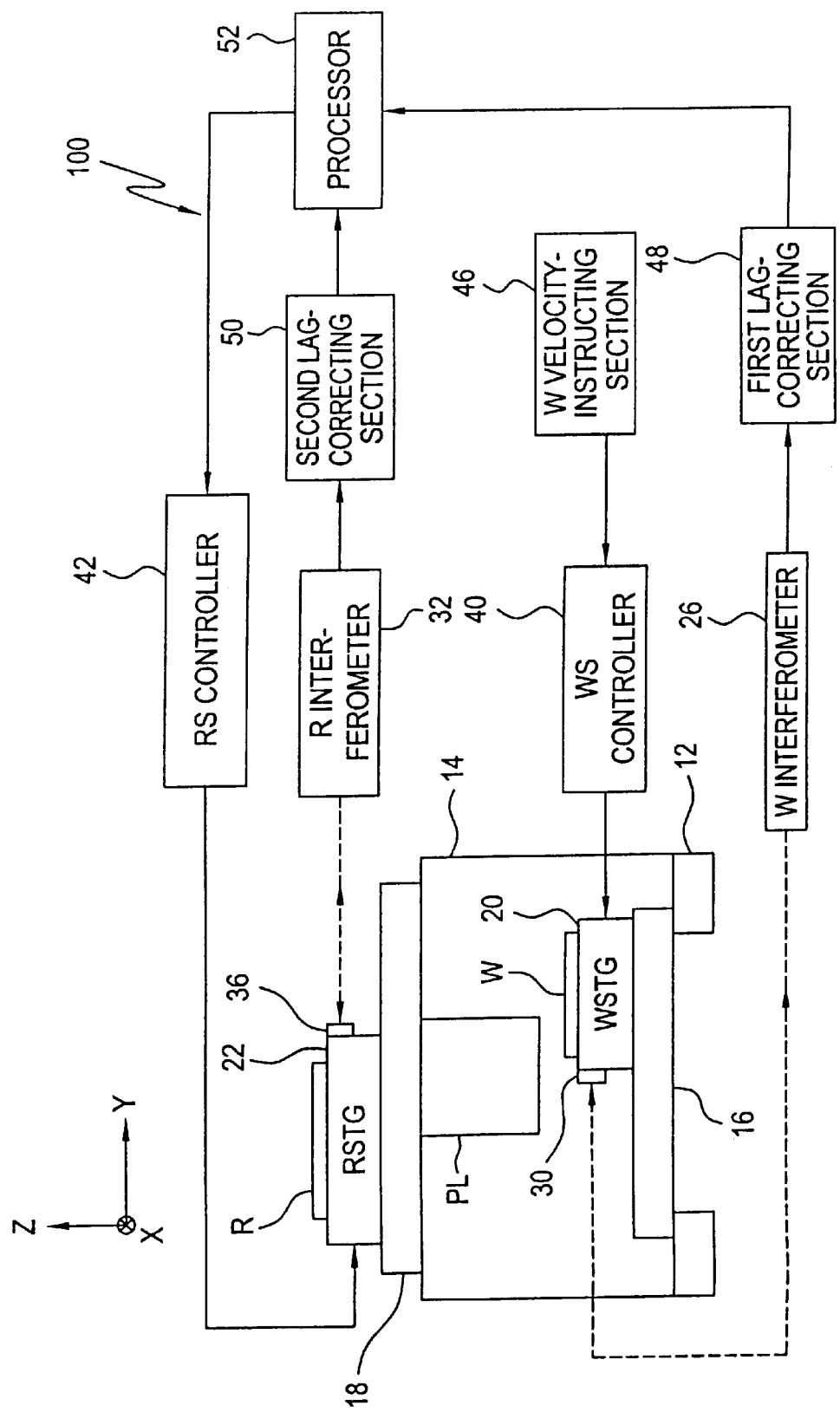
FIG. 4 shows a block diagram illustrating an arrangement of a stage driving control apparatus and an exposure apparatus including the control apparatus according to a second embodiment.

FIG. 4 shows an arrangement including a stage driving control apparatus 100 and a scanning type exposure apparatus according to a second embodiment.

In FIG. 4, a main column body 114 and a wafer support stand 116 are placed on a vibration-preventive pedestal 112. A reticle support stand 118 is placed on the main column body 114.

A wafer stage (WSTG) 120 to serve as a substrate stage is provided on the wafer support stand 116, the wafer stage 120 being movable in a scanning direction (Y direction in FIG. 4) and an X direction perpendicular thereto (direction perpendicular to the plane of paper in FIG. 4). A reticle stage (RSTG) 122 to serve as a mask stage is provided on the reticle support stand 118, the reticle stage 122 being movable in the scanning direction.

A projection optical system PL is held on the main column body 114, the projection optical system PL being arranged over the wafer stage 120 with its optical axis directed in a direction (Z direction in FIG. 4) perpendicular to a movement plane of the wafer stage 120. A wafer W (5) as a photosensitive substrate is placed on the wafer stage 120, and a reticle R (12) as a mask is placed on the reticle stage 122. A pattern plane of the reticle and a surface of the wafer are conjugate with respect to the projection optical system PL (8).

A movement mirror 30 used for a wafer laser interferometer (W interferometer) 26 is provided at one end (left end in FIG. 4) in the scanning direction of the wafer stage 120, the movement mirror 30 extending in a direction perpendicular to the scanning direction. Similarly, a movement mirror 36 used for a reticle laser interferometer (R interferometer) 32 is provided at the other end (right end in FIG. 4) in the scanning direction of the reticle stage 122, the movement mirror 36 extending in the direction perpendicular to the scanning direction.

The stage driving control apparatus 100 is provided with the wafer laser interferometer (W interferometer) 26 to serve as a position-measuring unit for radiating a laser beam to the movement mirror 30 and receiving the reflected laser beam therefrom to detect the position of the wafer stage 120, the reticle laser interferometer (R interferometer) 32 to serve as a position-measuring unit for radiating a laser beam to the movement mirror 36 and receiving the reflected laser beam therefrom to detect the position of the reticle stage 122, a wafer stage controller 40 to serve as a first stage control system, a reticle stage controller 42, a velocity-instructing section (W velocity-instructing section) 46 for the wafer stage, a first lag-correcting section 48 to serve as a first time lag-correcting system for correcting a time lag of the wafer laser interferometer 26, a second lag-correcting section 50 to serve as a second time lag-correcting system for correcting a time lag of the reticle laser interferometer 32, and a processor 52.

The wafer stage controller 40 controls the velocity of the wafer stage 120 through an unillustrated driving system on the basis of a velocity command supplied from the velocity-instructing section 46 for the wafer stage.

The first lag-correcting section 48 corrects the time lag in positional measurement performed by the wafer laser interferometer 26 on the basis of the following expression (8).

$$WY'=WY+\Delta t_{WY} \cdot v_{WY} \qquad (8)$$

wherein:

WY': positional information on W stage after correction of time lag;

WY: measured value by W laser interferometer;

$\Delta t_{WY}$: lag time of W laser interferometer;

$v_{WY}$: scanning velocity of wafer stage.

Similarly, the second lag-correcting section 50 corrects the time lag in positional measurement performed by the reticle laser interferometer 32 on the basis of the following expression (9).

$$RY'=RY+\Delta t_{RY} \cdot v_{RY} \qquad (9)$$

wherein:

RY': positional information on R stage after correction of time lag;

RY: measured value by R laser interferometer;

$\Delta t_{RY}$: lag time of R laser interferometer;

$v_{RY}$: scanning velocity of reticle stage.

In the foregoing expressions, the lag time $\Delta t_{WY}$ of the W laser interferometer 26 and the lag time $\Delta t_{RY}$ of the R laser interferometer 32 are inherent values of the respective interferometers. In this embodiment, the time lag caused by the processing time of a light-receiving system and a circuit system of each of the laser interferometers has been previously measured directly by using an electric measuring device, and the result of measurement has been stored as the lag times $\Delta t_{WY}$, $\Delta t_{RY}$ in an unillustrated memory.

The positional information WY', RY' from the first and second lag-correcting sections 48, 50 is inputted into the processor 52 which calculates positional errors of the both stages 120, 122 on a reticle stage coordinate system on the basis of the following expression (10).

$$\mathrm{ErrR}_Y = a\mathrm{WY}' - \mathrm{RY}' \tag{10}$$

wherein:

ErrR$_Y$: positional error between both stages on reticle stage coordinate system;

a: reciprocal of projection magnification of projection optical system PL.

The reticle stage controller 42 constructs a second stage control system together with the arithmetic processing unit 52, which drives and controls the reticle stage 122 through an unillustrated driving system so that the positional error ErrR$_Y$ between the both stages 120, 122 outputted from the processor 52 becomes zero.

According to the stage driving control apparatus 100 constructed as described above, a velocity command (scan command) is given to the wafer stage controller 40, and the wafer stage 120 starts the scanning operation in the Y direction. As a result, the position of the wafer stage 120 which changes at every moment is measured by the wafer laser interferometer (W interferometer) 26. The first lag-correcting section 48 determines WY' by correcting the measured value WY obtained by the wafer laser interferometer 26 by using the expression (8). Similarly, the second lag-correcting section 50 determines RY' on the basis of the expression (9). The processor 52 calculates ErrR$_Y$ on the basis of the expression (10), and the reticle stage controller 42 drives and controls the reticle stage 122 so that ErrR$_Y$ becomes zero. Thus the reticle stage 122 and the wafer stage 120 are subjected to velocity control in conformity with the projection magnification ratio of the projection lens PL so that a projected image of the reticle R always remains static on the wafer W.

As explained above, according to the second embodiment, the time lags in measurement performed by the wafer laser interferometer 26 and the reticle laser interferometer 32 are corrected by the first and second lag-correcting sections 48, 50. Accordingly, even when the scanning velocities of the wafer stage 120 and the reticle stage 122 become high, the discrepancy in synchronization between the both stages 120, 122 scarcely occurs.

Third Embodiment

A third embodiment of the present invention will be explained below with reference to FIGS. 5 and 6. In a stage driving control apparatus and an exposure apparatus including the control apparatus of the third embodiment, interferometers are arranged in a different manner on both sides of the reticle stage 122 and the wafer stage 120, however, the entire arrangement is equivalent to that of the apparatus 100 and the exposure apparatus described in the second embodiment. Accordingly, in the following explanation, the same or equivalent components as those described in the second embodiment will be referred to by using the same reference numerals.

Figure 5:
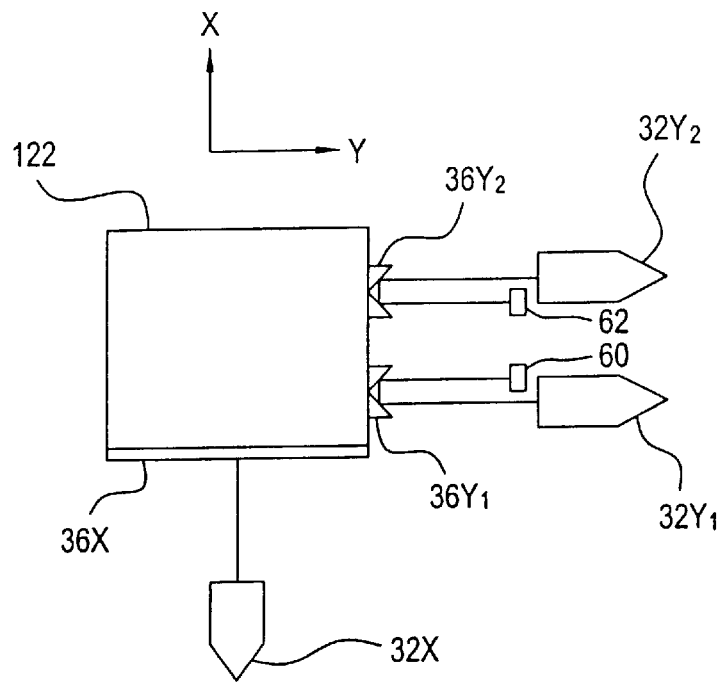
FIG. 5 shows a schematic plan view illustrating a reticle stage according to a third embodiment.

FIG. 5 shows a plan view of a reticle stage 122 for explaining an arrangement of reticle laser interferometers of the third embodiment. In FIG. 5, a pair of movement mirrors 36Y$_1$, 36Y$_2$ for the Y direction comprising reflective elements of the corner cube type are disposed and spaced apart with each other at a predetermined spacing distance at one end (right end in FIG. 5) in the Y direction of the reticle stage 122. A movement mirror 36X for the X direction is provided at one end in the X direction (lower end in FIG. 5), the movement mirror 36x extending in the Y direction.

The pair of the movement mirrors 36Y$_1$, 36Y$_2$ for the Y direction are irradiated with laser beams radiated from laser interferometers 32Y$_1$, 32Y$_2$ for the Y axis in parallel to the Y axis. The laser beams reflected by the movement mirrors 36Y$_1$, 36Y$_2$ are reflected and returned by reflective mirrors 60, 62 respectively. Namely, the laser interferometers 32Y$_1$, 32Y$_2$ construct a double-path interferometer, and thus the laser beams scarcely undergo occurrence of positional discrepancy due to rotation of the reticle stage 32.

The movement mirror 36X for the X direction is irradiated with a laser beam radiated from a laser interferometer 32X for the X axis in parallel to the X axis. The laser interferometer 32X receives the reflected beam from this movement mirror to measure the position of the reticle stage 122 in the X direction.

Figure 6:
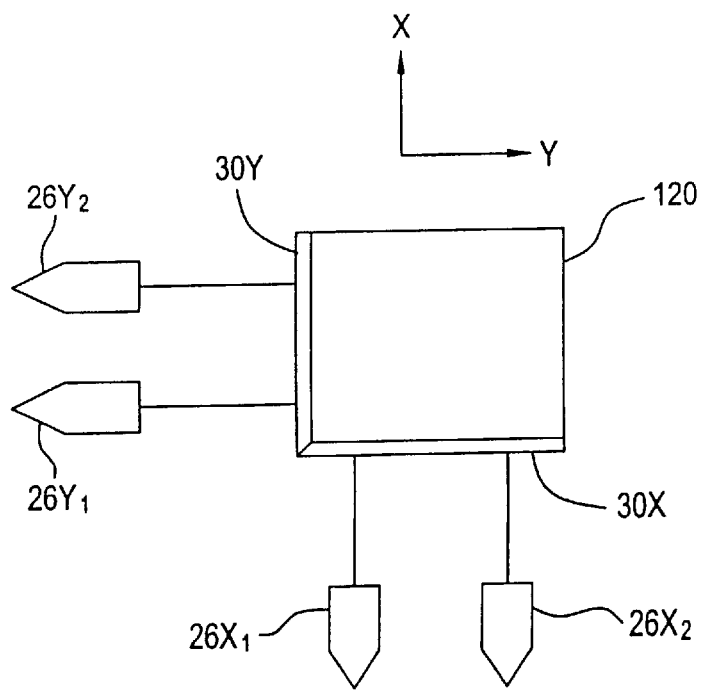
FIG. 6 shows a schematic plan view illustrating a wafer stage according to the third embodiment.

FIG. 6 shows a plan view of a wafer stage 120 for explaining an arrangement of wafer laser interferometers of the third embodiment. In FIG. 6, a movement mirror 30Y for the Y direction is provided at one end (left end in FIG. 6) of the wafer stage 120 in the Y direction, the movement mirror 30Y extending in the X direction. A movement mirror 30X for the X direction is provided at one end (lower end in FIG. 6) in the X direction, the movement mirror 30X extending in the Y direction.

The movement mirror 30Y for the Y direction is irradiated with laser beams at a predetermined spacing distance radiated from a pair of laser interferometers 26Y$_1$, 26Y$_2$ for the Y axis along optical paths parallel to the Y axis respectively. The laser interferometers 26Y$_1$, 26Y$_2$ receive the reflected beams from the movement mirror 30Y to measure the position of the wafer stage 20 in the Y direction respectively. The movement mirror 30X for the X direction is irradiated with laser beams at a predetermined spacing distance radiated from a pair of laser interferometers 26X$_1$, 26X$_2$ for the X axis along optical paths parallel to the X axis respectively. The laser interferometers 26X$_1$, 26X$_2$ receive the reflected beams from the movement mirror 30X to measure the position of the wafer stage 20 in the X direction respectively. As described above, each of the pairs of the wafer laser interferometers are provided for the X axis and the Y axis respectively in the third embodiment. Accordingly, in addition to the XY two-dimensional position of the wafer stage 120, the position in the rotational direction thereof can be measured as well.

The feature of the arrangement of the stage driving control apparatus of this embodiment is briefly explained as follows. Namely, in FIG. 4 described above, the W laser interferometer 26 is replaced with the four laser interferometers 26X$_1$, 26X$_2$, 26Y$_1$, 26Y$_2$ on the wafer side, and the R laser interferometer 32 is replaced with the three laser interferometers 32X, 32Y$_1$, 32Y$_2$ on the reticle side, corresponding to which the time lags in measurement by the four laser interferometers 26X$_1$, 26X$_2$, 26Y$_1$, 26Y$_2$ on the wafer side are corrected by the first lag-correcting section 48 respectively, and the time lags in measurement by the three laser interferometers 32X, 32Y$_1$, 32Y$_2$ on the reticle side are corrected by the second lag-correcting section 50 respectively.

The feature of this embodiment is explained in further detail as follows. Namely, the first lag-correcting section 48 corrects the time lags of the four laser interferometers $26X_1$, $26X_2$, $26Y_1$, $26Y_2$ in accordance with the following expression (11).

$$WX1' = WX1 + \Delta t_{WX1} \cdot v_{WX}$$
$$WX2' = WX2 + \Delta t_{WX2} \cdot v_{WX}$$
$$WY1' = WY1 + \Delta t_{WY1} \cdot v_{WY} \quad (11)$$
$$WY2' = WY2 + \Delta t_{WY2} \cdot v_{WY}$$

wherein:

WX1': positional information concerning laser interferometer $26X_1$ after correction of time lag;

WX2': positional information concerning laser interferometer $26X_2$ after correction of time lag;

WY1': positional information concerning laser interferometer $26Y_1$, after correction of time lag;

WY2': positional information concerning laser interferometer $26Y_2$ after correction of time lag;

WX1: measured value by laser interferometer $26X_1$;

WX2: measured value by laser interferometer $26X_2$;

WY1: measured value by laser interferometer $26Y_1$;

WY2: measured value by laser interferometer $26Y_2$;

$\Delta t_{WX1}$: lag time of laser interferometer $26X_1$;

$\Delta t_{WX2}$: lag time of laser interferometer $26X_2$;

$\Delta t_{WY1}$: lag time of laser interferometer $26Y_1$;

$\Delta t_{WY2}$: lag time of laser interferometer $26Y_2$;

$v_{WX}$: velocity of wafer stage in direction perpendicular to scanning direction;

$v_{WY}$: velocity of wafer stage in scanning direction.

Similarly, the second lag-correcting section 50 corrects the time lags of the three laser interferometers 32X, $32Y_1$, $32Y_2$ in accordance with the following expression (12).

$$RX' = RX + \Delta t_{RX} \cdot v_{RX}$$
$$RL' = RL + \Delta t_{RL} \cdot v_{RY} \quad (12)$$
$$RR' = RR + \Delta t_{RR} \cdot v_{RY}$$

wherein:

RX': positional information concerning laser interferometer 32X after correction of time lag;

RL': positional information concerning laser interferometer $32Y_1$, after correction of time lag;

RR': positional information concerning laser interferometer $32Y_2$ after correction of time lag;

RX: measured value by laser interferometer 32x;

RL: measured value by laser interferometer $32Y_1$;

RR: measured value by laser interferometer $32Y_2$;

$\Delta t_{RX}$: lag time of laser interferometer 32X;

$\Delta t_{RL}$: lag time of laser interferometer $32Y_1$;

$\Delta t_{RR}$: lag time of laser interferometer $32Y_2$;

$v_{RX}$: velocity of reticle stage in direction perpendicular to scanning direction;

$v_{RY}$: velocity of reticle stage in scanning direction.

In the foregoing expressions, the lag times $\Delta t_{WX1}$, $\Delta t_{WX2}$, $\Delta t_{WY1}$, $\Delta t_{WY2}$, $\Delta t_{RX}$, $\Delta t_{RL}$, $\Delta t_{RR}$ of the respective laser interferometers are inherent values of the respective interferometers. In this embodiment, the time lag caused by the processing time of a light-receiving system and a circuit system of each of the laser interferometers has been previously measured directly by using an electric measuring device, and the result of measurement has been stored as the lag times $\Delta t_{WX1}$, $\Delta t_{WX2}$, $\Delta t_{WY1}$, $\Delta t_{WY2}$, $\Delta t_{RX}$, $\Delta t_{RL}$, $\Delta t_{RR}$ in an unillustrated memory.

The positional information WX1', WX2', WY1', WY2' from the first lag-correcting section 48 and the positional information RX', RL', RR' from the second lag-correcting section 50 are inputted into the processor 52 which calculates positional errors ErrRX, ErrRL, ErrRR of the both stages 120, 122 on a coordinate system on the reticle interferometer side on the basis of the following expression (13).

$$\begin{bmatrix} ErrRX \\ ErrRL \\ ErrRR \end{bmatrix} = \begin{bmatrix} a_{11} & a_{12} & a_{13} & a_{14} \\ a_{21} & a_{22} & a_{23} & a_{24} \\ a_{31} & a_{32} & a_{33} & a_{34} \end{bmatrix} \begin{bmatrix} WX1' \\ WX2' \\ WY1' \\ WY2' \end{bmatrix} - \begin{bmatrix} RX' \\ RL' \\ RR' \end{bmatrix} + \begin{bmatrix} b_1 \\ b_2 \\ b_3 \end{bmatrix} \quad (13)$$

wherein:

$a_{11}$ to $a_{34}$: constant for defining relationship between reticle coordinate and wafer coordinate;

$b_1$ to $b_3$: offset between coordinate systems on sides of reticle interferometer and wafer interferometer.

In the expression (13), the matrix comprising elements of $a_{11}$ to $a_{34}$ is a coordinate conversion matrix.

The reticle stage controller 42 drives and controls the reticle stage 122 through an unillustrated driving system so that the positional errors ErrRX, ErrRL, ErrRR between the both stages 120, 122 outputted from the arithmetic processing unit 52 become zero. Parts or components of the third embodiment other than those described above are the same as those described in the second embodiment.

According to the stage driving control apparatus of the third embodiment constructed as described above, a velocity command (scan command) is given to the wafer stage controller 40, and the wafer stage 120 starts the scanning operation in the Y direction. The position of the wafer stage 120 is measured by the laser interferometers $26X_1$, $26X_2$, $26Y_1$, $26Y_2$. The first lag-correcting section 48 determines WX1', WX2', WY1', WY2' by correcting the measured values WX1, WX2, WY1, WY2 obtained by the laser interferometers $26X_1$, $26X_2$, $26Y_1$, $26Y_2$ in accordance with the expression (11). The wafer scanning velocity $v_{WX}$ in the X direction is usually almost zero, however, the velocity arises when a stage guide suffers rotation or bending in orthogonality.

Similarly, the second lag-correcting section 50 determines RX', RL', RR' on the basis of the expression (12). The processor 52 calculates ErrRX, ErrRL, ErrRR on the basis of the expression (13), and the reticle stage controller 42 drives and controls the reticle stage 122 so that ErrRX, ErrRL, ErrRR become zero. Thus the scanning velocities of the reticle stage 122 and the wafer stage 120 are controlled in conformity with the projection magnification ratio of the projection lens PL so that a projected image of a pattern on the reticle R always remains static on the wafer W during movement of the reticle stage 122 and the wafer stage 120.

As explained above, according to the third embodiment, even when the scanning velocities of the wafer stage 120 and the reticle stage 122 become high, it is possible to effectively avoid occurrence of the discrepancy in synchronization between the both stages 120, 122 in the same manner as described in the second embodiment. In addition, the third embodiment also provides an advantage that the discrepancy in the rotational direction, which may arise, for example, if there is a lag error between the laser interferometers $32Y_1$, $32Y_2$, can be also corrected.

As for the method for measuring the time lag of the laser interferometer, the second and third embodiment have been exemplified by the case in which the lag of the light-receiving system and the circuit system is directly measured by using an electric measuring device. However, the time lag of each of the laser interferometers may be indirectly measured by performing exposure at different scanning velocities, and measuring positional discrepancy between formed images.

The second and third embodiment have been exemplified by the stage control apparatus having the system in which the scan command is given to the wafer stage controller, the positional information on the wafer stage is given to the closed loop control system for the reticle stage, and the reticle stage follows the wafer stage. However, the present invention is not limited thereto. On the contrary, it is also possible to use a system in which the scan command is given to the reticle stage controller, the positional information on the reticle stage is given to a closed loop control system for the wafer stage, and the wafer stage follows the reticle stage.

The aforementioned embodiments have been exemplified by the case in which the control system for the wafer stage is constructed by the wafer stage controller 40 comprising the open loop velocity control system. However, for example, the following system is applicable. Namely, the output of the first lag-correcting section 48 is supplied to the wafer stage controller 40 in a feedback manner. The wafer stage controller 40 is allowed to include a PID control unit or the like which is operated by an operation signal obtained as a deviation between a differentiated value of the feedback signal and a velocity command value from the W velocity-instructing section. Thus the wafer stage is subjected to the velocity control by using a closed loop velocity control system for the wafer stage.

In the second and third embodiments, the measured values obtained by the laser interferometers have been corrected by using the first and second lag-correcting sections. However, such correcting sections (correcting means) are also applicable to the exposure apparatus shown in the first embodiment. In such application, a value obtained by correcting the time lag of the measured value obtained by the laser interferometer may be used as the measured value obtained by the laser interferometer in the first embodiment. Accordingly, it is possible to reduce not only the rotation of the wafer or the reticle but also the following error of the reticle stage and the wafer stage caused by the processing time lag of the laser interferometer.

In the first to third embodiment, the present invention has been applied to the projection exposure apparatus of the step-and-scan system. However, the present invention is also applicable to a projection exposure apparatus of the full-wafer exposure system such as a stepper. In the full-wafer exposure system, exposure is performed in a state in which a reticle and a wafer remain static. Accordingly, a high following velocity for positional adjustment is not required so much, and the stage on the wafer side is scarcely affected by yawing. Therefore, the necessity to apply the present invention is small in the present circumstances. However, if the degree of integration of semiconductor devices or other devices is further increased, and the necessary positional adjustment accuracy is increased, or if it is intended to further shorten the time for alignment in order to increase the throughput (processed number of wafers per unit time) of the exposure step, then the present invention is also effective in the full-wafer exposure system.

According to the exposure apparatus of the present invention, in any of the exposure apparatuses of the full-wafer exposure system and the scanning exposure system, an error vector quantity is determined by subtracting, from a vector quantity obtained by multiplying a vector quantity comprising components of results of measurement by one of two position-measuring units by a conversion matrix comprising components containing a magnification between a mask and a substrate and an angle of rotation between the mask and the substrate, a vector quantity comprising components of results of measurement by the other of the two position-measuring units, and the position of the corresponding stage of the two stages (the reticle stage and the wafer stage) is controlled in conformity with the error vector. Accordingly, an advantage is obtained in that the mask and the substrate can be subjected to positional adjustment highly accurately at a high following velocity even when one of the two stages is rotated.

Further, when the two position-measuring units have degrees of freedom of three or more axes in measurement respectively, then an advantage is obtained in that the mask and the substrate can be subjected to positional adjustment highly accurately in the translational direction and in the rotational direction.

Moreover, the scanning type exposure apparatus of the present invention provides an advantage in that the mask and the substrate can be subjected to positional adjustment and synchronous scanning highly accurately at a high following velocity even when, for example, one of the two stages is rotated due to yawing during scanning.

According to the scanning type exposure apparatus of the present invention, an effect, which has not been hitherto achieved, is obtained in that it is possible to effectively avoid occurrence of discrepancy in synchronization between the substrate stage and the mask stage caused by the time lag in positional measurement for the stages. Especially, the same result as that obtained by measuring the position of the stage in real-time is obtained, and thus the time lag in positional measurement can be reliably corrected.

The present invention may be practiced or embodied in other various forms without departing from the spirit or essential characteristics thereof. It will be understood that the scope of the present invention is indicated by the appended claims, and all variations and modifications concerning, for example, the way of measuring the time lag of the laser interferometer, the stage designated as one stage which follows the other stage, the loop system for velocity control, the type of the projection exposure apparatus, and the type of the exposure system, which come within the equivalent range of the claims, are embraced in the scope of the present invention.

What is claimed is:

1. An expose method for exposing an object with a pattern formed on a mask by relatively moving a mask stage holding the mask thereon and an object stage holding the object thereon, comprising:

measuring a position of the mask stage while relatively moving the mask stage and the object stage during exposure of the object;

measuring a position of the object stage while relatively moving the mask stage and the object stage during exposure of the object; and performing vector-calculation to calculate information for correcting a positional error between the mask stage and the object stage during exposure of the object based on positional information of the mask stage and positional information of the object stage, the vector-calculation performed with a vector quantity of the mask obtained from the measured position of the mask and a vector quantity of the object obtained from the measured position of the object;

the information for correcting the positional error being vector information for correcting the positional error between the mask stage and the object stage together with a rotational error between the mask stage and the object stage while relatively moving the mask stage and the object stage during exposure of the object.

2. The exposing method according to claim 1, further comprising correcting a relative position between the mask stage and the object stage based on the vector information.

3. The exposing method according to claim 1, further comprising:

obtaining information on a time lag in position measurement of the mask stage;

obtaining information on a time lag in position measurement of the object stage; and correcting a relative position between the mask stage and the object stage based on the information on time lags in position measurement of the mask stage and the object stage.

4. The exposing method according to claim 1, wherein degrees of freedom of measurement of not less than three axes is performed by measuring positions of the mask stage and the object stage.

5. The exposing method according to claim 1, wherein the mask stage and the object stage are driven by a driving system having degrees of freedom of measurement of not less than three axes.

6. A method for manufacturing a semiconductor device comprising transferring the pattern of the mask onto the object using the exposure method defined in claim 1.

7. An exposure method for exposing an object to be exposed with a pattern formed on a mask by relatively moving a mask stage holding the mask thereon and an object stage holding the object thereon, comprising:

measuring a position of the mask stage;

measuring a position of the object stage;

obtaining information on a time lag in position measurement of the mask stage;

obtaining information on a time lag in position measurement of the object stage; and controlling a relative position between the mask stage and the object stage based on results of position measurements of the mask stage and the object stage and the information on time lags in the position measurement of the mask stage and the object stage.

8. The exposing method according to claim 7, wherein degrees of freedom of measurement of not less than three axes is performed by the positional measurement of the mask stage and the object stage.

9. A method for manufacturing an exposure apparatus for transferring a pattern formed on a mask onto an object, the method comprising:

providing a mask stage that positions the mask;

providing an object stage that positions the object with respect to the mask pattern;

providing a mask stage position-measuring unit, connected to the mask stage, that measures a two-dimensional position of the mask stage;

providing an object stage position-measuring unit, connected to the object stage, that measures a two-dimensional position of the object stage;

providing a processor, connected to at least one of the mask stage position-measuring unit and the object stage position-measuring unit, that determines an error vector quantity, wherein the processor:

(a) determines a first vector quantity from the measuring performed by one of the mask stage position-measuring unit and the object stage position-measuring unit, (b) determines from the first vector quantity, a target position vector quantity of the stage corresponding to the other of the mask stage position-measuring unit and the object stage position-measuring unit, (c) determines a second vector quantity from the measuring performed by the other of the mask stage position-measuring unit and the object stage position-measuring unit, and (d) determines the error vector quantity by subtracting the second vector quantity from the target position vector quantity; and providing a controller that controls a position or a velocity of the stage corresponding to the other of the mask stage position-measuring unit and the object stage position-measuring unit in conformity with the error vector determined by the processor.

10. A substrate processed by the exposure apparatus manufactured by the method according to claim 9.

11. A method for manufacturing an exposure apparatus for transferring an image of a pattern formed on a mask onto an object by illuminating the mask and synchronously scanning the mask and the object with respect to an illumination area on the mask, comprising:

providing a mask stage that positions the mask;

providing a substrate stage that positions the object with respect to the mask pattern;

providing a mask stage position-measuring unit, connected to the mask stage, that measures a two-dimensional position of the mask stage;

providing an object stage position-measuring unit, connected to the object stage, that measures a two-dimensional position of the substrate stage;

providing a projection optical system, disposed between the mask and the object, that projects the pattern on the mask onto the object at a predetermined magnification;

providing a processor, connected to at least one of the mask stage position-measuring unit and the object stage position-measuring unit, that determines an error vector quantity, wherein the processor:

(a) determines a first vector quantity from the measuring performed by one of the mask stage position-measuring unit and the object stage position-measuring unit, (b) determines from the first vector quantity, a target vector quantity of the stage corresponding to the other of the mask stage position-measuring unit and the object stage position-measuring unit, (c) determines a second vector quantity from the measuring performed by the other of the mask stage position-measuring unit and the object stage position-measuring unit, and (d) determines the error vector quantity by subtracting the second vector quantity from the target vector quantity; and providing a controller that controls a position or a velocity of the stage corresponding to the other of the mask stage position-measuring unit and the object stage position-measuring unit in conformity with the error vector determined by the processor.

12. A substrate processed by the exposure apparatus manufactured by the method according to claim 11.

13. A method for manufacturing an exposure apparatus for transferring an image of a pattern formed on a mask onto an object to be exposed by illuminating the mask and synchronously scanning the mask and the object with respect to an illumination area on the mask, the method comprising:

providing a mask stage that positions the mask;

providing an object stage that positions the object with respect to the mask pattern;

providing a mask stage position-measuring unit, connected to the mask stage, that measures a two-dimensional position of the mask stage;

providing an object stage position-measuring unit, connected to the object stage, that measures a two-dimensional position of the object stage;

providing a first time lag-correcting system, connected to the mask stage position-measuring unit, that corrects a time lag in measurement by the mask stage position-measuring unit;

providing a second time lag-correcting system, connected to the object stage position-measuring unit, that corrects a time lag in measurement by the object stage position-measuring unit; and providing a stage controller, connected to at least one stage of the object stage and the mask stage, that controls movement of the one stage on the basis of positional information on the mask stage of which the time lag has been corrected and positional information on the object stage of which the time lag has been corrected so that the mask stage and the object stage are in a predetermined positional relationship.

14. A substrate processed by the exposure apparatus manufactured by the method according to claim 13.

15. An exposure method for exposing an object with a pattern formed on a mask while relatively moving the mask and the object, comprising:

measuring a position of the mask, which has degrees of freedom of not less than three axes, while relatively moving the mask and the object during exposure of the object;

measuring a position of the object, which has degrees of freedom of not less than three axes, while relatively moving the mask and the object during exposure of the object; and controlling the relative movement of the mask and the object during exposure of the object based on a vector-calculation with a vector quantity of the mask obtained from the measured position of the mask having degrees of freedom of not less than three axes and a vector quantity of the object obtained from the measured position of the object having degrees of freedom of not less than three axes, so that relative position and rotation between the mask and the object are optimized.

16. The exposure method according to claim 15, wherein the step of controlling the relative movement of the mask and the object further comprises obtaining vector information for correcting positional error between the mask and the object together with rotational error between the mask and the object by the vector-calculation.

17. A method for manufacturing a semiconductor device comprising transferring the pattern of the mask onto the object using the exposure method defined in claim 15.

* * * * *